(12) United States Patent
Zhou et al.

(10) Patent No.: US 11,803,128 B2
(45) Date of Patent: Oct. 31, 2023

(54) CONTROL METHOD AND DEVICE OF OVERLAY ACCURACY

(71) Applicant: CHANGXIN MEMORY TECHNOLOGIES, INC., Hefei (CN)

(72) Inventors: Xiaofang Zhou, Hefei (CN); Xing Zhang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 30 days.

(21) Appl. No.: 17/454,242

(22) Filed: Nov. 9, 2021

(65) Prior Publication Data

US 2022/0121130 A1    Apr. 21, 2022

Related U.S. Application Data

(63) Continuation of application No. PCT/CN2021/100189, filed on Jun. 15, 2021.

(30) Foreign Application Priority Data

Oct. 15, 2020    (CN) .......................... 202011101233.2

(51) Int. Cl.
  *G03F 7/20* (2006.01)
  *H01L 21/66* (2006.01)
  *G03F 7/00* (2006.01)

(52) U.S. Cl.
  CPC ...... *G03F 7/70633* (2013.01); *G03F 7/70525* (2013.01); *H01L 22/20* (2013.01)

(58) Field of Classification Search
  CPC ....... A01K 15/04; Y10S 256/00; E04H 17/18; E04H 17/20; G03F 7/70525; G03F 7/70633; H01L 22/20; H01L 22/12
  See application file for complete search history.

(56) References Cited

U.S. PATENT DOCUMENTS

| 7,046,332 | B2 | 5/2006 | Kuo |
| 7,056,631 | B2 | 6/2006 | Kuo |
| 7,645,546 | B2 | 1/2010 | Yang |

(Continued)

FOREIGN PATENT DOCUMENTS

| CN | 101458456 A | 6/2009 |
| CN | 101458456 B | 12/2011 |

(Continued)

*Primary Examiner* — Deoram Persaud
(74) *Attorney, Agent, or Firm* — SYNCODA LLC; Feng Ma (57) ABSTRACT

In a control method for overlay accuracy, whether a similar layer of a present layer exists is determined first, where both the present layer and the similar layer are aligned relative to a same reference layer, and overlay accuracy requirements of both the present layer and the similar layer are relative to the reference layer; if so, an overlay error compensation value of a present batch of wafers at the present layer is determined according to an overlay error value of the present batch of wafers at the similar layer and/or an overlay error value of a previous batch of wafers at the similar layer; and a photoetching process is performed on the present layer of the present batch of wafers by means of the overlay error compensation value of the present batch of wafers at the present layer.

13 Claims, 4 Drawing Sheets

(56) References Cited

U.S. PATENT DOCUMENTS

| | | | |
|---|---|---|---|
| 2004/0101983 A1* | 5/2004 | Jones | H01L 22/20 |
| | | | 257/E21.525 |
| 2004/0219442 A1 | 11/2004 | Kuo | |
| 2005/0112480 A1 | 5/2005 | Kuo | |
| 2006/0064194 A1* | 3/2006 | Lee | G03F 7/70533 |
| | | | 700/121 |
| 2007/0184628 A1 | 8/2007 | Yang | |
| 2018/0173110 A1* | 6/2018 | Hu | G03F 7/705 |
| 2018/0314168 A1* | 11/2018 | Van Haren | G03F 7/705 |
| 2020/0026201 A1* | 1/2020 | Hauptmann | G03F 7/70525 |
| 2020/0057388 A1* | 2/2020 | Sun | G03F 7/7065 |
| 2021/0397101 A1* | 12/2021 | Dong | G03F 9/00 |
| 2022/0066329 A1* | 3/2022 | Zhang | G03F 7/70633 |

FOREIGN PATENT DOCUMENTS

| | | |
|---|---|---|
| CN | 106325001 A | 1/2017 |
| CN | 108628107 A | 10/2018 |
| CN | 110187615 A | 8/2019 |
| CN | 110941150 A | 3/2020 |
| EP | 3396457 A1 | 10/2018 |

\* cited by examiner

CONTROL METHOD AND DEVICE OF OVERLAY ACCURACY

CROSS-REFERENCE TO RELATED APPLICATIONS

This is a continuation of International Application No. PCT/CN2021/100189 filed on Jun. 15, 2021, which claims priority to Chinese Patent Application No. 202011101233.2 filed on Oct. 15, 2020. The disclosures of the above-references applications are hereby incorporated by reference in their entirety.

BACKGROUND

A photoetching process is a key step in a semiconductor manufacturing process. Photoetching is a technical process in which patterns on a photomask are transferred to wafers through a series of operations such as alignment, exposure and the like. An overlay error of photoetching is one of the key parameters to measure the photoetching process. In the photoetching process, a run to run (R2R) system will be used to perform overlay control of photoetching. For the first batch of wafers or the first few batches of wafers of products, since the feedback data of overlay error values is less, acquired overlay error compensation values of the first batch of wafers or the first few batches of wafers are not accurate enough, which causes reworking, consumes time and increases production costs.

SUMMARY

The disclosure relates to the field of semiconductor manufacturing technologies, and in particular to a control method and device of overlay accuracy.

According to some embodiments, a first aspect of the disclosure provides a control method of overlay accuracy, which includes: determining whether a similar layer of a present layer exists is determined, where the similar layer and the present layer at least meet following conditions: both the present layer and the similar layer are aligned relative to a same reference layer, and overlay accuracy requirements of both the present layer and the similar layer are relative to the reference layer; determining an overlay error compensation value of a present batch of wafers at the present layer according to at least one of an overlay error value of the present batch of wafers at the similar layer or an overlay error value of a previous batch of wafers at the similar layer; and performing a photoetching process on the present layer of the present batch of wafers by means of the overlay error compensation value of the present batch of wafers at the present layer.

According to some embodiments, a second aspect of the disclosure provides a control apparatus of overlay accuracy, which includes: a processor; and a memory configured to store instructions executable by the processor; the processor is configured to: determine whether a similar layer of a present layer exists, where the similar layer and the present layer at least meet following conditions: both the present layer and the similar layer are aligned relative to a same reference layer, and overlay accuracy requirements of both the present layer and the similar layer are relative to the reference layer; determine an overlay error compensation value of a present batch of wafers at the present layer according to at least one of an overlay error value of the present batch of wafers at the similar layer or an overlay error value of a previous batch of wafers at the similar layer; and perform a photoetching process on the present layer of the present batch of wafers by means of the overlay error compensation value of the present batch of wafers at the present layer.

According to some embodiments, a third aspect of the disclosure provides a non-transitory computer-readable storage medium. Computer executable instructions are stored in the computer-readable storage medium. When the computer executable instructions are executed by the processor, the method as described in the first aspect of the disclosure is implemented.

BRIEF DESCRIPTION OF THE DRAWINGS

The accompanying drawings referred to in the specification are a part of this disclosure, and provide illustrative embodiments consistent with the disclosure and, together with the detailed description, serve to illustrate some embodiments of the disclosure.

Through the above drawings, the specific embodiments of the disclosure are shown and will be described in more detail later. These drawings and text descriptions are not intended to limit the conceptual scope of the disclosure in any way, but are intended to explain the concept of the disclosure for those skilled in the art by referring to the embodiments.

DETAILED DESCRIPTION

Exemplary embodiments (examples of which are illustrated in the accompanying drawings) are elaborated below. The following description refers to the accompanying drawings, in which identical or similar elements in two drawings are denoted by identical reference numerals unless indicated otherwise. The exemplary implementation modes may take on multiple forms, and should not be taken as being limited to examples illustrated herein. Instead, by providing such implementation modes, embodiments herein may become more comprehensive and complete, and comprehensive concept of the exemplary implementation modes may be delivered to those skilled in the art. Implementations set forth in the following exemplary embodiments do not represent all implementations in accordance with the subject disclosure. Rather, they are merely examples of the apparatus and method in accordance with certain aspects herein as recited in the accompanying claims.

Embodiments of the disclosure provide a control method of overlay accuracy. When two different layers of a wafer are aligned relative to the same reference layer and the overlay accuracy requirements of the two layers are relative to the same reference layer, an overlay error value of one layer may be used as reference data to determine an overlay error compensation value of the other layer, therefore, the reference data of the overlay error compensation value is increased, and finally, the overlay error compensation value is more accurate.

Figure 1:
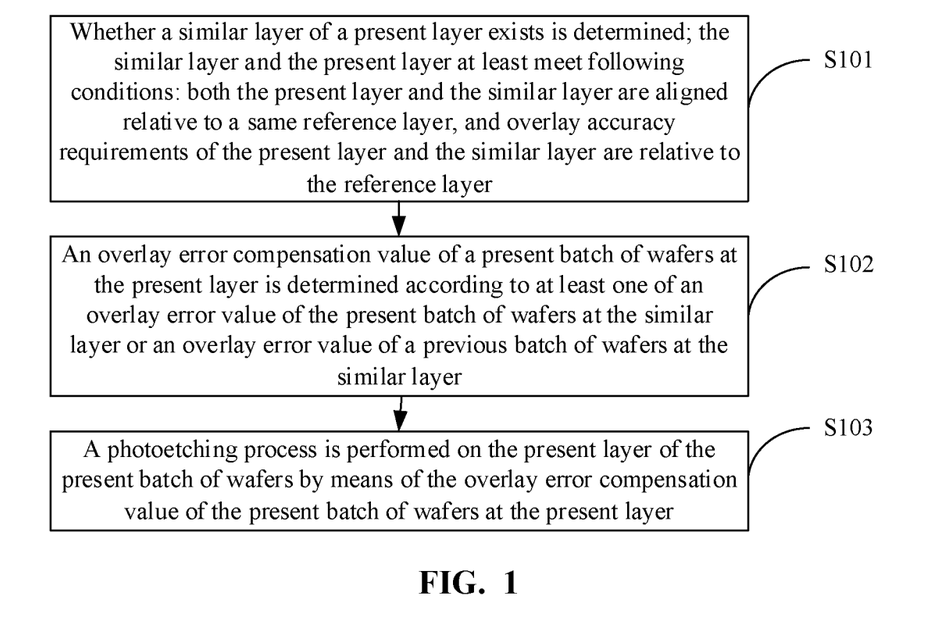
FIG. 1 is a flowchart of a control method of overlay accuracy provided by a first embodiment of the present disclosure.

FIG. 1 is a flowchart of a control method of overlay accuracy provided by a first embodiment of the present disclosure. The method of this embodiment includes as follows.

At S101, whether a similar layer of a present layer exists is determined. The similar layer and the present layer at least meet following conditions: both the present layer and the similar layer are aligned relative to a same reference layer, and overlay accuracy requirements of the present layer and the similar layer are relative to the reference layer.

Figure 2:
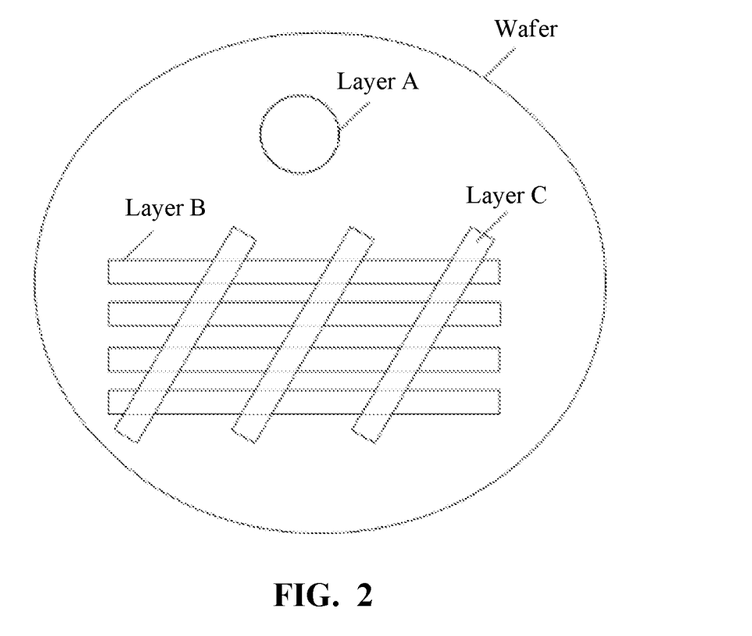
FIG. 2 is a schematic diagram of partial layers of a wafer according to some embodiments of the present disclosure.

As illustrated in FIG. 2, a layer A is subjected to a photoetching process before a layer B, the layer B is subjected to the photoetching process before a layer C, and an alignment mark is located in the layer A. When the layer B and the layer C are exposed, each of the photoetching machines uses the alignment mark formed in the layer A on the wafer to perform alignment. At the same time, overlay accuracy requirements of both the layer B and the layer C are relative to the layer A. Specifically, overlay accuracy among the layer A, the layer B and the layer C includes: overlay accuracy of the layer B to the layer A, overlay accuracy of the layer C to the layer A, and overlay accuracy of the layer C to the layer B. The overlay accuracy requirements of both the layer B and the layer C are relative to the layer A, which means that in the control of overlay accuracy, an overlay error of the layer B to the layer A and an overlay error of the layer C to the layer A need to be compensated, so that the overlay error of the layer B to the layer A and the overlay error of the layer C to the layer A are within a preset range. In the above example, the layer A is the reference layer, the layer C is the present layer, and the layer B is a similar layer of the layer C.

In some embodiments, a plurality of similar layers are provided. For example, a layer B' is exposed after the layer B and before the layer C, an alignment mark when the layer B' is exposed is the alignment mark in the layer A, and then, overlay accuracy of the layer B' to the layer A needs to be controlled within a preset range. Both the layer B and the layer B' are similar layers of the layer C.

In some embodiments, whether the present layer and the similar layer(s) are aligned with the same reference layer may be determined by determining whether alignment trees of the present layer and the similar layer are the same. Taking the present layer as an example, the alignment tree of the present layer is configured to describe an alignment mark of a certain layer on a wafer used when the present layer is exposed. When the alignment tree of the present layer and the alignment tree of the similar layer are the same, it means that the present layer and the similar layer are aligned with the alignment mark of the same layer during exposure, that is, the present layer and the similar layer are aligned with the same reference layer.

In some embodiments, whether the overlay accuracy requirements of the present layer and the similar layer are relative to the reference layer may be determined by using overlay (erro) trees of the present layer and the similar layer. Taking the present layer as an example, the overlay tree of the present layer is configured to describe the measurement and feedback compensation of an overlay mark of a certain layer on a wafer by the present layer. If the overlay tree of the present layer is the same as the overlay tree of the reference layer, it means that both the present layer and the reference layer are subjected to overlay error control relative to the same layer, that is, the overlay accuracy requirements of the present layer and the reference layer are relative to the reference layer.

In some embodiments, the similar layer and the present layer also meet a following condition: a model of a photo-etching machine used for the present layer is the same as a model of a photoetching machine used for the similar layer. The same model may mean a same laser wavelength of the photoetching machine. For example, ArF, KrF and I-line photoetching machines may be used. The photoetching machine may also be different types of photoetching machines under the same laser wavelength, such as ASML's immersed ArF photoetching machines 1950i and 1970i, etc.

In some embodiments, the similar layer and the present layer also meet a following condition: a same photoetching machine is used for the present layer and the similar layer.

At S102, an overlay error compensation value of a present batch of wafers at the present layer is determined according to at least one of an overlay error value of the present batch of wafers at the similar layer or an overlay error value of a previous batch of wafers at the similar layer.

In some embodiments, the present batch of wafers is the first batch of wafers. The present batch of wafers is the first batch of wafers to be produced offline. When a photoetching machine performs photoetching on the present batch of wafers, for the present batch of wafers, no previous batch of wafers may exist. At this time, the overlay error compensation value of the present batch of wafers at the present layer may be determined according to the overlay error value of the present batch of wafers at the similar layer. Specifically, an overlay error value of the present batch of wafers at the similar layer to the reference layer may be measured by an overlay error measuring machine, and an overlay error compensation value of the present batch of wafers at the similar layer may be calculated by means of the overlay error value.

The overlay error compensation value of the present batch of wafers at the present layer to the reference layer may be the same as the overlay error compensation value of the present batch of wafers at the similar layer to the reference layer. Since the present batch of wafers is the first batch of wafers, there is no reference data to provide the overlay error compensation when a photoetching process is performed on the present layer. In this embodiment, the characteristics of the similar layer and the present layer may be used to provide the overlay error compensation. The characteristics of the similar layer and the present layer include: both the present layer and the similar layer are aligned relative to the same reference layer, and the overlay accuracy requirements of both the present layer and the similar layer are relative to the reference layer. When the photoetching process is performed on the present layer, pre-compensation of an overlay error is performed by using the same overlay error compensation value of the similar layer to the reference layer, which can compensate for the overlay error caused by the wafers, improve the overlay accuracy of the first batch of wafers in the photoetching process of the present layer to the reference layer, reduce the risk of reworking, and reduce the production cost.

In some embodiments, the present batch of wafers is not the first batch of wafers, that is, for the present batch of wafers the previous batch of wafers may exist, and then, an overlay error compensation value of the present batch of wafers at the similar layer may also be determined according to the overlay error values of the previous batch of wafers at the similar layer and the present layer. Specifically, an overlay error value of the previous batch of wafers at the similar layer to the reference layer and an overlay error value of the previous batch of wafers at the present layer to the reference layer may be measured by the overlay error measuring machine, and an overlay error compensation value of the previous batch of wafers at the similar layer to the reference layer and an overlay error compensation value of the previous batch of wafers at the present layer to the reference layer may be calculated according to the overlay error value of the previous batch of wafers at the similar layer to the reference layer and the overlay error value of the previous batch of wafers at the present layer to the reference layer.

Exemplarily, an overlay error compensation value M of the present batch of wafers at the similar layer may be calculated according to a following formula:

$$M=Ax+By,$$

where x represents an overlay error compensation value of the previous batch of wafers at the similar layer, y represents an overlay error compensation value of the previous batch of wafers at the present layer, A represents a weight of the overlay error compensation value of the previous batch of wafers at the similar layer, and B represents a weight of the overlay error compensation value of the previous batch of wafers at the present layer, where A is greater than and equal to 0, and is less than and equal to 1 ($0 \leq A \leq 1$), B is greater than and equal to 0, and is less than and equal to 1 ($0 \leq B \leq 1$), and A plus B is 1 (A+B=1). The overlay error compensation value of the previous batch of wafers at the similar layer is determined according to the overlay error value of the previous batch of wafers at the similar layer, the overlay error compensation value of the previous batch of wafers at the present layer is determined according to the overlay error value of the previous batch of wafers at the present layer, and the values of A and B may be set in advance.

The overlay error value of the previous batch of wafers at the similar layer to the reference layer and the overlay error value of the previous batch of wafers at the present layer to the reference layer are used as reference data to calculate the overlay error compensation value of the present batch of wafers at the similar layer to the reference layer, so that the amount of data is enriched, and the calculated overlay error compensation value of the present batch of wafers at the similar layer to the reference layer is more reasonable and accurate.

As an example, both A and B are equal to 1/2, that is, an average value of the overlay error compensation value of the previous batch of wafers at the similar layer to the reference layer and the overlay error compensation value of the previous batch of wafers at the present layer to the reference layer is used as the overlay error compensation value of the present batch of wafers at the similar layer to the reference layer, thereby simplifying a calculation method of the overlay error compensation value.

In another example, A is greater than B (A>B), for example, A is 3/5 and B is 2/5, or A is 3/4 and B is 4/1. The overlay error caused by a photomask of the similar layer may be partially compensated by increasing the weight of the overlay error compensation value of the previous batch of wafers at the similar layer to the reference layer, so that the calculated overlay error compensation value of the present batch of wafers at the similar layer to the reference layer is more accurate.

In some embodiments, the present batch of wafers is not the first batch of wafers, that is, the previous batch of wafers of the present batch of wafers may exist, so that an overlay error compensation value of the present batch of wafers at the present layer may be determined according to the overlay error value of the present batch of wafers at the similar layer and the overlay error value of the previous batch of wafers at the similar layer; or, an overlay error compensation value of the present batch of wafers at the present layer may be determined according to the overlay error values of the previous batch of wafers at the similar layer and the present layer and the overlay error value of the present batch of wafers at the similar layer.

Exemplarily, an overlay error value of the previous batch of wafers at the similar layer to the reference layer, an overlay error value of the previous batch of wafers at the present layer to the reference layer, and an overlay error value of the present batch of wafers at the similar layer to the reference layer may be measured by the overlay error measuring machine.

In some embodiments, an overlay error compensation value M of the present batch of wafers at the present layer may be calculated according to a following formula:

$$M=Ax+By+Cz,$$

where x represents an overlay error compensation value of the previous batch of wafers at the similar layer, y represents an overlay error compensation value of the previous batch of wafers at the present layer, z represents an overlay error compensation value of the present batch of wafers at the similar layer, A represents a weight of the overlay error compensation value of the previous batch of wafers at the similar layer, B represents a weight of the overlay error compensation value of the previous batch of wafers at the present layer, and C represents a weight of the overlay error compensation value of the present batch of wafers at the similar layer, where $0 \leq A \leq 1$, $0 \leq B \leq 1$, $0 \leq C \leq 1$, and A+B+C=1. The overlay error compensation value of the previous batch of wafers at the similar layer is determined according to the overlay error value of the previous batch of wafers at the similar layer, the overlay error compensation value of the previous batch of wafers at the present layer is determined according to the overlay error value of the previous batch of wafers at the present layer, the overlay error compensation value of the present batch of wafers at the similar layer is determined according to the overlay error value of the present batch of wafers at the similar layer, and the values of A, B and C may be set in advance.

As an example, A, B and C are all equal to 1/3. In another example, B>A and/or B>C, for example, B is 3/5, A is 1/5, and C is 1/5. The overlay error caused by a photomask of the present layer may be partially compensated by increasing the weight of the overlay error compensation value of the previous batch of wafers at the present layer to the reference layer, so that the calculated overlay error compensation value of the present batch of wafers at the present layer to the reference layer is more accurate.

In some embodiments, the previous batch of wafers includes a previous batch of wafers or a plurality of previous batches of wafers.

At S103, a photoetching process is performed on the present layer of the present batch of wafers by means of the overlay error compensation value of the present batch of wafers at the present layer.

Specifically, the overlay error compensation value of the present batch of wafers at the present layer may be updated into an unloading value, and a photoetching machine performs a photoetching process on the present layer of the present batch of wafers by means of the updated unloading value.

Figure 3:
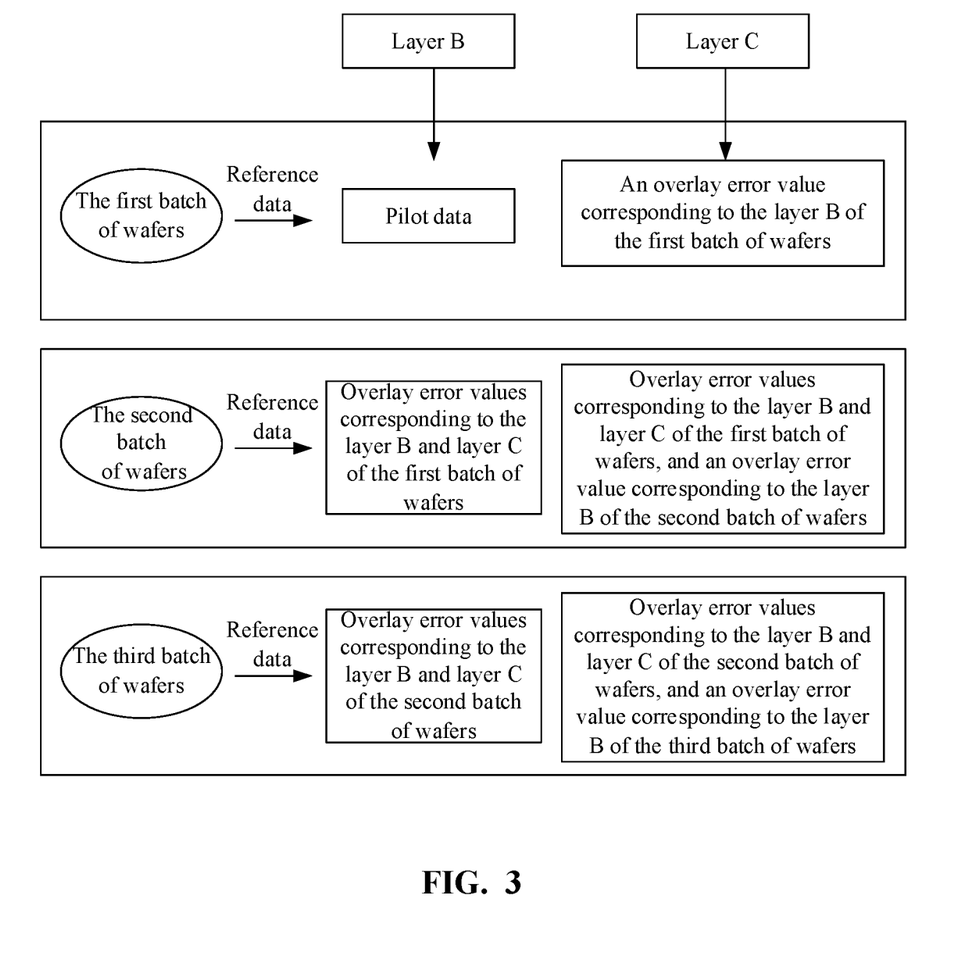
FIG. 3 is a schematic diagram of overlay error compensation on a layer B and a layer C by using a method according to some embodiments of the present disclosure.

FIG. 3 is a schematic diagram of overlay error compensation on a layer B and a layer C by using a method according to some embodiments of the present disclosure.

Referring to FIG. 3, firstly, photoetching is performed on layers B and C of the first batch of wafers; then, photoetching is performed on layers B and C of the second batch of wafers; and finally, photoetching is performed on layers B and C of the third batch of wafers. The photoetching process of the layer B is performed before the photoetching process of the layer C. When the photoetching is performed on the layer B of the first batch of wafers, by default, photoetching on the layer A of the first batch of wafers is already completed. Both the layer B and the layer C are aligned relative to the layer A, and the overlay accuracy requirements of both the layer B and the layer C are relative to the layer A.

When the photoetching is performed on the layer B of the first batch of wafers, since there is no overlay error value of other batches of wafers and no overlay error value of the similar layer as reference data, pilot data is used as the reference data to determine an overlay error compensation value of the first batch of wafers during photoetching on the layer B. As an example, the pilot data may be preset to be 0.

When the photoetching is performed on the layer C of the first batch of wafers, an overlay error value of the layer B of the first batch of wafers is used as reference data, an overlay error compensation value of the layer C of the first batch of wafers is determined according to the overlay error value of the layer B of the first batch of wafers, and a photoetching process is performed by means of the overlay error compensation value of the layer C of the first batch of wafers.

When the photoetching is performed on the layer B of the second batch of wafers, the overlay error value of the layer B of the first batch of wafers and an overlay error value of the layer C of the first batch of wafers are used as reference data, an overlay error compensation value of the layer B of the second batch of wafers is determined according to the overlay error value of the layer B of the first batch of wafers and the overlay error value of the layer C of the first batch of wafers, and a photoetching process is performed by means of the overlay error compensation value of the layer B of the second batch of wafers.

When the photoetching is performed on the layer C of the second batch of wafers, the overlay error value of the layer B of the first batch of wafers, the overlay error value of the layer C of the first batch of wafers and an overlay error value of the layer B of the second batch of wafers are used as reference data, an overlay error compensation value of the layer C of the second batch of wafers is determined according to the overlay error value of the layer B of the first batch of wafers, the overlay error value of the layer C of the first batch of wafers and the overlay error value of the layer B of the second batch of wafers, and a photoetching process is performed by means of the overlay error compensation value of the layer C of the second batch of wafers.

When the photoetching is performed on the layer B of the third batch of wafers, the overlay error value of the layer B of the second batch of wafers and an overlay error value of the layer C of the second batch of wafers are used as reference data, an overlay error compensation value of the layer B of the third batch of wafers is determined according to the overlay error value of the layer B of the second batch of wafers and the overlay error value of the layer C of the second batch of wafers, and a photoetching process is performed by means of the overlay error compensation value of the layer B of the third batch of wafers.

In another example, the overlay error value of the layer B of the first batch of wafers, the overlay error value of the layer C of the first batch of wafers, the overlay error value of the layer B of the second batch of wafers and the overlay error value of the layer C of the second batch of wafers may be used as reference data.

In another example, the overlay error value of the layer B of the first batch of wafers and the overlay error value of the layer B of the second batch of wafers may be used as reference data; or, the overlay error value of the layer C of the first batch of wafers and the overlay error value of the layer C of the second batch of wafers may be used as reference data.

This embodiment does not limit this. Any one, two, or three of the overlay error values of the layers B and layers C of the first batch of wafers and the second batch of wafers may be used as reference data.

When the photoetching is performed on the layer C of the third batch of wafers, the overlay error value of the layer B of the second batch of wafers, the overlay error value of the layer C of the second batch of wafers and an overlay error value of the layer B of the third batch of wafers are used as reference data, an overlay error compensation value of the layer C of the third batch of wafers is determined according to the overlay error value of the layer B of the second batch of wafers, the overlay error value of the layer C of the second batch of wafers and the overlay error value of the layer B of the third batch of wafers, and a photoetching process is performed by means of the overlay error compensation value of the layer C of the third batch of wafers.

In another example, the overlay error value of the layer B of the first batch of wafers, the overlay error value of the layer C of the first batch of wafers, the overlay error value of the layer B of the second batch of wafers, the overlay error value of the layer C of the second batch of wafers and the overlay error value of the layer B of the third batch of wafers are used as reference data.

Similarly, any one, two, three, or four of the overlay error values of the layer B and layer C of the first batch of wafers, the overlay error values of the layer B and layer C of the second batch of wafers and the overlay error value of the layer B of the third batch of wafers may be used as reference data.

In this embodiment, whether the similar layer of the present layer exists is determined. Both the present layer and the similar layer are aligned relative to the same reference layer, and the overlay accuracy requirements of both the present layer and the similar layer are relative to the reference layer. The overlay error compensation value of the present batch of wafers at the present layer is determined according to the overlay error value of the present batch of wafers at the similar layer and/or the overlay error value of the previous batch of wafers at the similar layer. A photoetching process is performed on the present layer of the present batch of wafers by means of the overlay error compensation value of the present batch of wafers at the present layer. By means of this method, the overlay error values of the present batch of wafers and/or the previous batch of wafers at the similar layer may be used as reference data, thereby enriching the reference data, and improving the accuracy of the overlay error compensation value.

Figure 4:
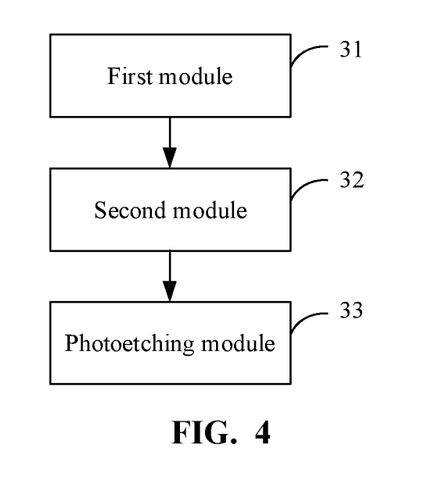
FIG. 4 is a schematic structural diagram of a control apparatus of overlay accuracy provided by a second embodiment of the present disclosure.

FIG. 4 is a schematic structural diagram of a control apparatus of overlay accuracy provided by a second embodiment of the present disclosure. The control apparatus includes: a first module 31, a second module 32 and a photoetching module 33.

The first module 31 is configured to determine whether a similar layer of a present layer exists. The similar layer and the present layer at least meet following conditions: both the present layer and the similar layer are aligned relative to a same reference layer, and overlay accuracy requirements of both the present layer and the similar layer are relative to the reference layer.

The second module 32 is configured to determine an overlay error compensation value of a present batch of wafers at the present layer according to at least one of an overlay error value of the present batch of wafers at the similar layer or an overlay error value of a previous batch of wafers at the similar layer.

The photoetching module 33 is configured to perform a photoetching process on the present layer of the present batch of wafers by means of the overlay error compensation value of the present batch of wafers at the present layer.

In some embodiments, the control apparatus further includes: a third module, configured to determine an overlay error compensation value of the present batch of wafers at the similar layer according to overlay error values of the previous batch of wafers at the similar layer and the present layer. The photoetching module is further configured to perform a photoetching process on the similar layer of the present batch of wafers by means of the overlay error compensation value of the present batch of wafers at the similar layer.

In some embodiments, the second module 32 is specifically configured to: determine the overlay error compensation value of the present batch of wafers at the present layer according to overlay error values of the previous batch of wafers at the similar layer and the present layer and the overlay error value of the present batch of wafers at the similar layer.

In some embodiments, the overlay error compensation value of the present batch of wafers at the present layer is identical with an overlay error compensation value of the present batch of wafers at the similar layer.

In some embodiments, the third module is specifically configured to: calculate an overlay error compensation value M of the present batch of wafers at the similar layer according to a following formula:

$$M=Ax+By,$$

where x represents an overlay error compensation value of the previous batch of wafers at the similar layer, y represents an overlay error compensation value of the previous batch of wafers at the present layer, A represents a weight of the overlay error compensation value of the previous batch of wafers at the similar layer, and B represents a weight of the overlay error compensation value of the previous batch of wafers at the present layer; where $0 \leq A \leq 1$, $0 \leq B \leq 1$, and $A+B=1$.

In some embodiments, the second module 32 is specifically configured, when determining the overlay error compensation value of the present batch of wafers at the present layer according to the overlay error values of the previous batch of wafers at the similar layer and the present layer and the overlay error value of the present batch of wafers at the similar layer, to:

calculate an overlay error compensation value M of the present batch of wafers at the present layer is calculated according to a following formula:

$$M=Ax+By+Cz,$$

where x represents an overlay error compensation value of the previous batch of wafers at the similar layer, y represents an overlay error compensation value of the previous batch of wafers at the present layer, z represents an overlay error compensation value of the present batch of wafers at the similar layer, A represents a weight of the overlay error compensation value of the previous batch of wafers at the similar layer, B represents a weight of the overlay error compensation value of the previous batch of wafers at the present layer, and C represents a weight of the overlay error compensation value of the present batch of wafers at the similar layer; where $0 \leq A \leq 1$, $0 \leq B \leq 1$, $0 \leq C \leq 1$, and $A+B+C=1$.

In some embodiments, the present batch of wafers is a first batch of wafers, or the present batch of wafers is not the first batch of wafers.

In some embodiments, the similar layer and the present layer also meet a following condition: a model of a photoetching machine used for the present layer is identical with a the model of a photoetching machine used for the similar layer.

In some embodiments, a plurality of similar layers are provided.

In some embodiments, the previous batch of wafers includes a previous batch of wafers or a plurality of previous batches of wafers.

The control apparatus of this embodiment may be configured to execute the method described in the above method embodiments. The specific implementation manners and technical effects are similar, and will not be repeated here.

In some embodiments, a non-transitory computer-readable storage medium including instructions is further provided. The non-transitory computer-readable storage medium may be a Read-Only Memory (ROM), a Random-Access Memory (RAM), a Compact Disc Read-Only Memory (CD-ROM), a magnetic tape, a floppy disc, an optical data storage device, and the like. When the instructions in the storage medium are executed by a processor of an electronic device, the electronic device can execute the method described in the above method embodiments.

The embodiments of the disclosure further provide a computer program product, including computer programs. When the computer programs are executed by the processor, the method described in the above method embodiments is implemented. The specific implementation manners and technical effects are similar, and will not be repeated here.

The various device components, modules, units, blocks, or portions may have modular configurations, or are composed of discrete components, but nonetheless can be referred to as "modules" in general. In other words, the "components," "modules, " "blocks, " "portions," or "units" referred to herein may or may not be in modular forms.

In the present disclosure, the terms "installed," "connected," "coupled," "fixed" and the like shall be understood broadly, and can be either a fixed connection or a detachable connection, or integrated, unless otherwise explicitly defined. These terms can refer to mechanical or electrical connections, or both. Such connections can be direct connections or indirect connections through an intermediate medium. These terms can also refer to the internal connections or the interactions between elements. The specific meanings of the above terms in the present disclosure can be understood by those of ordinary skill in the art on a case-by-case basis.

In the description of the present disclosure, the terms "one embodiment," "some embodiments," "example, " "specific example, " or "some examples, " and the like can indicate a specific feature described in connection with the embodiment or example, a structure, a material or feature included in at least one embodiment or example. In the present disclosure, the schematic representation of the above terms is not necessarily directed to the same embodiment or example.

Moreover, the particular features, structures, materials, or characteristics described can be combined in a suitable manner in any one or more embodiments or examples. In addition, various embodiments or examples described in the specification, as well as features of various embodiments or examples, can be combined and reorganized.

While this specification contains many specific implementation details, these should not be construed as limitations on the scope of any claims, but rather as descriptions of features specific to particular implementations. Certain features that are described in this specification in the context of separate implementations can also be implemented in combination in a single implementation. Conversely, various features that are described in the context of a single implementation can also be implemented in multiple implementations separately or in any suitable subcombination.

Moreover, although features can be described above as acting in certain combinations and even initially claimed as such, one or more features from a claimed combination can in some cases be excised from the combination, and the claimed combination can be directed to a subcombination or variation of a subcombination.

It is intended that the specification and embodiments be considered as examples only. Other embodiments of the disclosure will be apparent to those skilled in the art in view of the specification and drawings of the present disclosure. That is, although specific embodiments have been described above in detail, the description is merely for purposes of illustration. It should be appreciated, therefore, that many aspects described above are not intended as required or essential elements unless explicitly stated otherwise.

Various modifications of, and equivalent acts corresponding to, the disclosed aspects of the example embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

It should be understood that "a plurality" or "multiple" as referred to herein means two or more. "And/or," describing the association relationship of the associated objects, indicates that there may be three relationships, for example, A and/or B may indicate that there are three cases where A exists separately, A and B exist at the same time, and B exists separately. The character "/" generally indicates that the contextual objects are in an "or" relationship.

In the present disclosure, it is to be understood that the terms "lower," "upper," "under" or "beneath" or "underneath," "above," "front," "back," "left," "right," "top," "bottom," "inner," "outer," "horizontal," "vertical," and other orientation or positional relationships are based on example orientations illustrated in the drawings, and are merely for the convenience of the description of some embodiments, rather than indicating or implying the device or component being constructed and operated in a particular orientation. Therefore, these terms are not to be construed as limiting the scope of the present disclosure.

Moreover, the terms "first" and "second" are used for descriptive purposes only and are not to be construed as indicating or implying a relative importance or implicitly indicating the number of technical features indicated. Thus, elements referred to as "first" and "second" may include one or more of the features either explicitly or implicitly. In the description of the present disclosure, "a plurality" indicates two or more unless specifically defined otherwise.

In the present disclosure, a first element being "on" a second element may indicate direct contact between the first and second elements, without contact, or indirect geometrical relationship through one or more intermediate media or layers, unless otherwise explicitly stated and defined. Similarly, a first element being "under," "underneath" or "beneath" a second element may indicate direct contact between the first and second elements, without contact, or indirect geometrical relationship through one or more intermediate media or layers, unless otherwise explicitly stated and defined.

Some other embodiments of the present disclosure can be available to those skilled in the art upon consideration of the specification and practice of the various embodiments disclosed herein. The present application is intended to cover any variations, uses, or adaptations of the present disclosure following general principles of the present disclosure and include the common general knowledge or conventional technical means in the art without departing from the present disclosure. The specification and examples can be shown as illustrative only, and the true scope and spirit of the disclosure are indicated by the following claims.

What is claimed is:

1. A control method of overlay accuracy, comprising:
   determining whether a similar layer of a present layer exists; wherein the similar layer and the present layer at least meet following conditions: both the present layer and the similar layer are aligned relative to a same reference layer, the reference layer is subjected to a photoetching process before the similar layer, the similar layer is subjected to the photoetching process before the present layer, an alignment mark is located in the reference layer, and overlay accuracy requirements of both the present layer and the similar layer are relative to the reference layer;
   determining an overlay error compensation value of a present batch of wafers at the similar layer
   performing the photoetching process on the similar layer of the present batch of wafers by means of the overlay error compensation value of the present batch of wafers al the similar laver:
   determining an overlay error compensation value of the present batch of wafers at the present layer; and
   performing the photoetching process on the present layer of the present batch of wafers by means of the overlay error compensation value of the present batch of wafers at the present layer,
   wherein in response to the present batch of wafers being a first batch of wafers, determining the overlay error compensation value of the present batch of wafers at the present layer comprises:
      determining the overlay error compensation value of the present batch of determining the overlay error compensation value of the present batch of wafers at the present layer according to overlay error value of the present batch of wafers at the similar layer;
   wherein in response to the present batch of waters being not the first batch of wafers, determining the overlay error compensation value of the present batch of wafers at the similar layer comprises:
      determining the overlay error compensation value of the present batch of wafers at the similar layer according to overlay error values of a previous batch of waters at the similar layer and the present layer; and
   determining the overlay error compensation value of the present batch of wafers at the present layer comprises:

determining the overlay error compensation value of the present batch of wafers at the present layer according to overlay error values of the previous batch of wafers at the similar layer and the present layer and the overlay error value of the present batch of wafers at the similar layer.

2. The control method of claim 1, wherein the overlay error compensation value of the present batch of wafers at the present layer is identical with an overlay error compensation value of the present batch of wafers at the similar layer.

3. The control method of claim 1, wherein the determining the overlay error compensation value of the present batch of wafers at the similar layer according to the overlay error values of the previous batch of wafers at the similar layer and the present layer comprises:

calculating an overlay error compensation value M of the present batch of wafers at the similar layer according to a following formula:

$$M=Ax+By,$$

wherein x represents an overlay error compensation value of the previous batch of wafers at the similar layer, y represents an overlay error compensation value of the previous batch of wafers at the present layer, A represents a weight of the overlay error compensation value of the previous batch of wafers at the similar layer, and B represents a weight of the overlay error compensation value of the previous batch of wafers at the present layer; wherein $0 \leq A \leq 1$, $0 \leq B \leq 1$, and $A+B=1$.

4. The control method of claim 3, wherein values of both A and B are equal to 1/2; or, A>B.

5. The control method of claim 1, wherein the determining the overlay error compensation value of the present batch of wafers at the present layer according to the overlay error values of the previous batch of wafers at the similar layer and the present layer and the overlay error value of the present batch of wafers at the similar layer comprises:

calculating an overlay error compensation value M of the present batch of wafers at the present layer according to a following formula:

$$M=Ax+By+Cz,$$

wherein x represents an overlay error compensation value of the previous batch of wafers at the similar layer, y represents an overlay error compensation value of the previous batch of wafers at the present layer, z represents an overlay error compensation value of the present batch of wafers at the similar layer, A represents a weight of the overlay error compensation value of the previous batch of wafers at the similar layer, B represents a weight of the overlay error compensation value of the previous batch of wafers at the present layer, and C represents a weight of the overlay error compensation value of the present batch of wafers at the similar layer; wherein $0 \leq A \leq 1$, $0 \leq B \leq 1$, $0 \leq C \leq 1$ and $A+B+C=1$.

6. The control method of claim 5, wherein values of A, B and C are all equal to 1/3; or, B>A and/or B>C.

7. The control method of claim 1, wherein the similar layer and the present layer also meet a following condition: a model of a photoetching machine used for the present layer is identical with a model of a photoetching machine used for the similar layer.

8. The control method of claim 1, wherein a plurality of similar layers are provided.

9. The control method of claim 1, wherein the previous batch of wafers comprises a previous batch of wafers or a plurality of previous batches of wafers.

10. A control apparatus of overlay accuracy, comprising:
a processor; and
a memory configured to store instructions executable by the processor;
wherein the processor is configured to:
determine whether a similar layer of a present layer exists; wherein the similar layer and the present layer at least meet following conditions: both the present layer and the similar layer are aligned relative to a same reference layer, the reference layer is subjected to a photoetching process before the similar layer, the similar layer similar layer is subjected to the photoetching process before the present layer an alignment mark is located in the reference layer, and overlay accuracy requirements of both the present layer and the similar layer are relative to the reference layer;
determine an overlay error compensation value of a present batch of wafers at the similar layer;
perform the photoetching process on the similar layer of the present batch of waters by means of the overlay error compensation value of the present batch of wafers at the similar layer:
determine an overlay error compensation value of the present batch of wafers at the present layer ; and
perform the photoetching process on the present layer of the present batch of wafers by means of the overlay error compensation value of the present batch of wafers at the present layer,
wherein the processor is further configured to:
in response to the present batch of wafers being a first batch of wafers, determine the overlay error compensation value of the present batch of wafers at the present layer according to overlay error value of the present batch of wafers at the similar layer; and
in response to the present batch of waters being not the first batch of waters, determine the overlay error compensation value of the present batch of wafers at the similar layer according to overlay error values of a previous batch of waters at the similar layer and the present layer; and determine the overlay error compensation value of the present batch of wafers at the present layer according to overlay error values of the previous batch of wafers at the similar layer and the present layer and the overlay error value of the present batch of wafers at the similar layer.

11. A non-transitory computer-readable storage medium, wherein instructions are stored in the computer-readable storage medium, and when the instructions run on a computer, the computer executes a control method of overlay accuracy, comprising:
determining whether a similar layer of a present layer exists; wherein the similar layer and the present layer at least meet following conditions: both the present layer and the similar layer are aligned relative to a same reference layer, the reference layer is subjected lo a photoetching process before the similar layer the similar layer is subjected to the photoetching process before the present layer, an alignment mark is located in the reference layer and overlay accuracy requirements of both the present layer and the similar layer are relative to the reference layer;
determining an overlay error compensation value of a present batch of wafers at the similar laver:

performing the photoetching process on the similar layer of the present batch of wafers by means of the overlay error compensation value of the present batch of wafers at the similar layer;

determining an overlay error compensation value of the present batch of wafers at the present layer; and performing the photoetching process on the present layer of the present batch of wafers by means of the overlay error compensation value of the present batch of wafers at the present layer, wherein in response to the present batch of wafers being a first batch of waters. determining the overlay error compensation value of the present batch of wafers at the present layer comprises:

determining the overlay error compensation value of the present batch of determining the overlay error compensation value of the present batch of wafers at the present layer according to overlay error value of the present batch of wafers at the similar layer;

wherein in response to the present batch of wafers being not the first batch of waters, determining the overlay error compensation value of the present batch of wafers at the similar layer comprises:

determining the overlay error compensation value of the present batch of wafers al The similar layer according to overlay error values of a previous batch of wafers at the similar layer and the present laver; and determining the overlay error compensation value of the present batch of wafers at the present layer comprises:

determining the overlay error compensation value of the present batch of wafers at the present layer according to overlay error values of the previous batch of wafers at the similar layer and the present layer and the overlay error value of the present batch of wafers at the similar layer.

12. The non-transitory computer-readable storage medium of claim 11, wherein the overlay error compensation value of the present batch of wafers at the present layer is identical with an overlay error compensation value of the present batch of wafers at the similar layer.

13. The non-transitory computer-readable storage medium of claim 11, wherein a plurality of similar layers are provided.

* * * * *